(12) United States Patent
Kim et al.

(10) Patent No.: US 10,881,010 B2
(45) Date of Patent: Dec. 29, 2020

(54) DISPLAY DEVICE AND MULTI-PANEL DISPLAY DEVICE

(71) Applicant: LG Display Co., Ltd., Seoul (KR)

(72) Inventors: DuckSu Kim, Goyang-si (KR); Yongjoon Kim, Incheon (KR)

(73) Assignee: LG Display Co., Ltd., Seoul (KR)

( * ) Notice: Subject to any disclaimer, the term of this patent is extended or adjusted under 35 U.S.C. 154(b) by 6 days.

(21) Appl. No.: 16/460,726

(22) Filed: Jul. 2, 2019

(65) Prior Publication Data

US 2020/0015370 A1 Jan. 9, 2020

(30) Foreign Application Priority Data

Jul. 3, 2018 (KR) .................. 10-2018-0076828

(51) Int. Cl.
| | |
|---|---|
| *H05K 5/00* | (2006.01) |
| *E05D 3/02* | (2006.01) |
| *E05D 5/02* | (2006.01) |
| *H05K 5/02* | (2006.01) |

(52) U.S. Cl.
CPC ............ *H05K 5/0021* (2013.01); *E05D 3/02* (2013.01); *E05D 5/02* (2013.01); *H05K 5/0017* (2013.01); *H05K 5/0204* (2013.01); *E05Y 2900/606* (2013.01)

(58) Field of Classification Search
None
See application file for complete search history.

(56) References Cited

U.S. PATENT DOCUMENTS

| | | | | |
|---|---|---|---|---|
| 5,128,662 | A | | 7/1992 | Failla |
| 5,995,179 | A | * | 11/1999 | Tamura ................. G09F 9/3026 349/58 |
| 6,729,054 | B1 | * | 5/2004 | VanderTuin ............. G09F 9/30 16/236 |
| 8,213,167 | B2 | * | 7/2012 | Kim ....................... G06F 1/1601 361/679.26 |
| 8,384,616 | B2 | * | 2/2013 | Elliott ................... G09F 9/3026 345/1.3 |
| 8,539,705 | B2 | * | 9/2013 | Bullister ............... G06F 1/1615 40/733 |

(Continued)

FOREIGN PATENT DOCUMENTS

| | | |
|---|---|---|
| CN | 202549188 U | 11/2012 |
| DE | 101 50 757 A1 | 8/2002 |

(Continued)

*Primary Examiner* — Xanthia C Cunningham
(74) *Attorney, Agent, or Firm* — Seed IP Law Group LLP

(57) ABSTRACT

A display device is disclosed that includes a display panel including a display area and a non-display area, a first coupling unit adjacent to one edge of the display panel and fixed to a rear surface of the display panel, and a second coupling unit adjacent to the other edge of the display panel and fixed to the rear surface of the display panel. The first coupling unit includes a hinge plate and a plurality of first fastening holes and the second coupling unit includes a fixing plate including a plurality of second fastening holes and a plurality of protrusions. When a plurality of display devices are connected together, the first coupling unit and the second coupling unit of each display device are coupled together, wherein the coupling of the coupling units aligns the panels of the multi-panel display device relative to each other.

20 Claims, 11 Drawing Sheets

(56) References Cited

U.S. PATENT DOCUMENTS

| | | | |
|---|---|---|---|
| 10,672,306 B1* | 6/2020 | Whidden | G09F 15/0068 |
| 2006/0082518 A1* | 4/2006 | Ram | G06F 3/1446 |
| | | | 345/1.1 |
| 2010/0053027 A1* | 3/2010 | Tonnison | G06F 1/1624 |
| | | | 345/1.3 |
| 2011/0084892 A1* | 4/2011 | Han | E05D 11/04 |
| | | | 345/1.3 |
| 2011/0216064 A1 | 9/2011 | Dahl et al. | |
| 2011/0291915 A1* | 12/2011 | Tani | G06F 1/1622 |
| | | | 345/1.3 |
| 2014/0056031 A1* | 2/2014 | Lee | G02B 6/0093 |
| | | | 362/633 |
| 2014/0168983 A1* | 6/2014 | Opsomer | H05K 13/0015 |
| | | | 362/249.07 |
| 2015/0043136 A1 | 2/2015 | Kim et al. | |
| 2015/0169274 A1* | 6/2015 | Holung | G06F 3/1423 |
| | | | 345/1.3 |
| 2016/0040462 A1* | 2/2016 | Nakamura | G09F 9/30 |
| | | | 361/679.27 |
| 2017/0031643 A1* | 2/2017 | Jeong | G06F 1/1647 |
| 2017/0105293 A1* | 4/2017 | Kim | H05K 5/0021 |
| 2017/0192273 A1* | 7/2017 | Fan | G06F 3/1423 |
| 2017/0295654 A1* | 10/2017 | Choi | H05K 5/0017 |
| 2017/0303408 A1* | 10/2017 | Lee | H05K 5/0021 |
| 2018/0039471 A1* | 2/2018 | Yanagisawa | G06F 3/044 |
| 2018/0090556 A1* | 3/2018 | Lee | G09G 3/3208 |
| 2018/0220537 A1* | 8/2018 | Heo | G09F 9/3026 |

FOREIGN PATENT DOCUMENTS

| | | |
|---|---|---|
| KR | 10-2006-0069160 A | 6/2006 |
| WO | 2017/209744 A1 | 12/2017 |
| WO | 2019/135562 A1 | 7/2019 |

* cited by examiner

US 10,881,010 B2

DISPLAY DEVICE AND MULTI-PANEL DISPLAY DEVICE

CROSS-REFERENCE TO RELATED APPLICATIONS

This application claims the priority of Korean Patent Application No. 10-2018-0076828, filed Jul. 3, 2018, in the Korean Intellectual Property Office, the disclosure of which is incorporated herein by reference, in its entirety.

BACKGROUND

Technical Field

The present disclosure relates to a display device, and more particularly, to a multi-panel display device including a plurality of display panels.

Description of the Related Art

Display devices are known for use as a monitor of a computer, a television, or a cellular phone. For example, there are organic light emitting display (OLED) devices, which are a self-emitting device that generates an image on the display without a separate light source and liquid crystal display (LCD) devices, which utilize a separate light source to produce an image on the display, among others.

Further, research has been conducted on such display devices to produce displays with a larger display size, and a reduced volume and weight.

However, with larger display devices, using a single panel for the display device is not practical. Rather, multiple relatively large panels are joined together to form an aggregate multi-panel display device with a larger viewing area than presently known single panel devices. For example, to construct a billboard sized display device using OLED or LCD devices typically involves coupling a plurality of such display devices together. However, multiple issues can arise when coupling multiple panels together. One such issue is warpage of the panels due to the coupling. Warpage is especially common in thinner panels with weaker support structures. Other issues include a non-active area of the displays forming a line between the active area of the displays where the images are displayed. Moreover, it is difficult to align the panels relative to each other in a proper alignment, meaning that it is difficult to position each of the panels square with respect to each other and parallel to horizontal and vertical. Still further, if a single panel in the middle of the array of panels requires repair or replacement, current systems for coupling together multiple panels do not allow for a single panel to be removed and replaced without disassembling the entire panel array, which is inefficient and at a considerable cost the owner.

BRIEF SUMMARY

In various embodiments, the present disclosure provides a multi-panel display device in which a size of a non-display area where no image is displayed is reduced.

In one or more embodiments, the present disclosure provides a display device and a multi-panel display device wherein coupling devices of the display device guides alignment of a plurality of display panels in the multi-panel display device.

In various embodiments, the present disclosure provides a display device and a multi-panel display device in which a single display panel can be disassembled from an array of a plurality of panels instead of disassembling all the plurality of display panels in the array.

The present disclosure is not limited to the above-mentioned examples, and other embodiments, which are not mentioned above, can be clearly understood by those skilled in the art from the following description.

According to one or more embodiments of the present disclosure, a display device includes: a first display panel including a display area and a non-display area, the first display panel including a first surface opposite a second surface and a first edge opposite a second edge, a first coupling assembly disposed adjacent to the first edge of the first display panel, the first coupling assembly fixed to the second surface of the first display panel, and a second coupling assembly disposed adjacent to the second edge of the first display panel and fixed to the second rear surface of the first display panel, wherein the first coupling assembly includes a hinge plate rotatably coupled to the first display panel and a plurality of first fastening holes in the hinge plate, and wherein the second coupling assembly includes a fixing plate including a plurality of second fastening holes and a plurality of protrusions extending from the fixing plate. Therefore, when a plurality of display panels are connected, the first coupling assembly and the second coupling assembly of each display device are coupled to connect the plurality of display panels, wherein the first coupling assembly and the second coupling assembly align the display panels of the display device.

According to one or more embodiments of the present disclosure, a multi-panel display device includes: a plurality of display panels each including a display area and a non-display area extending around the display area, wherein the non-display areas of adjacent display panels of the plurality of display panels overlap each other, wherein each display panel of the plurality of display panels includes a first surface opposite a second surface; and a plurality of coupling assemblies fixed to the second surface of each of the plurality of display panels, wherein a first one of the plurality of coupling assemblies corresponding to a first one of the plurality of display panels is configured to be coupled to a second one of the plurality of coupling assemblies corresponding to a second one of the plurality of coupling assemblies corresponding to a second one of the plurality of display panels that is adjacent to the first one of the plurality of display panels. Therefore, the plurality of display panels are coupled to each other by overlapping the non-display areas so that the size of the non-display area where no image is displayed may be reduced.

According to one or more embodiments of the present disclosure, a display device is provided that includes: a first display panel having an active area and a non-active area, the first display panel including a first surface opposite a second surface and a first edge opposite a second edge, the first display panel further including: a first coupling assembly including a first base plate coupled to the second surface of the first display panel and a hinge plate rotatably coupled to the first base plate of the first coupling assembly; a second coupling assembly including a second base plate coupled to the second surface of the first display panel and a fixing plate; and a second display panel having an active area and a non-active area, the second display panel including a first surface opposite a second surface and a first edge opposite a second edge, the second display panel further including: a first coupling assembly including a first base plate coupled to the second surface of the second display panel and a hinge plate rotatably coupled to the first base plate of the first coupling assembly; and a second coupling assembly including a second base plate coupled to the second surface of the second display panel and a fixing plate, wherein the second coupling assembly of the first display panel is coupled to the first coupling assembly of the second display panel to couple the first display panel to the second display panel. As such, multiple displays can be coupled together in a configuration that allows for repair and replacement of individual display panels in a multi-panel display device.

Other detailed matters of the embodiments of the present disclosure are included in the detailed description and the drawings.

According to the present disclosure, in a multi-panel display device, a size of a non-display area where no image is displayed is reduced to improve a quality of an image implemented in the multi-panel display device.

According to the present disclosure, warpage between a plurality of display panels which are fastened to each other in a multi-panel display device is reduced.

According to the present disclosure, in order to replace a specific display panel, only a specific display panel can be selectively replaced without disassembling all the plurality of display panels. As such, the multi-panel display device may be easily repaired or replaced.

The embodiments according to the present disclosure are not limited to the examples above, and more details of the embodiments of the present disclosure are included in the present specification.

BRIEF DESCRIPTION OF THE SEVERAL VIEWS OF THE DRAWINGS

The above and other aspects, features and advantages of the present disclosure will be more clearly understood from the following detailed description taken in conjunction with the accompanying drawings, in which.

DETAILED DESCRIPTION OF THE EMBODIMENT

Figure 1A:
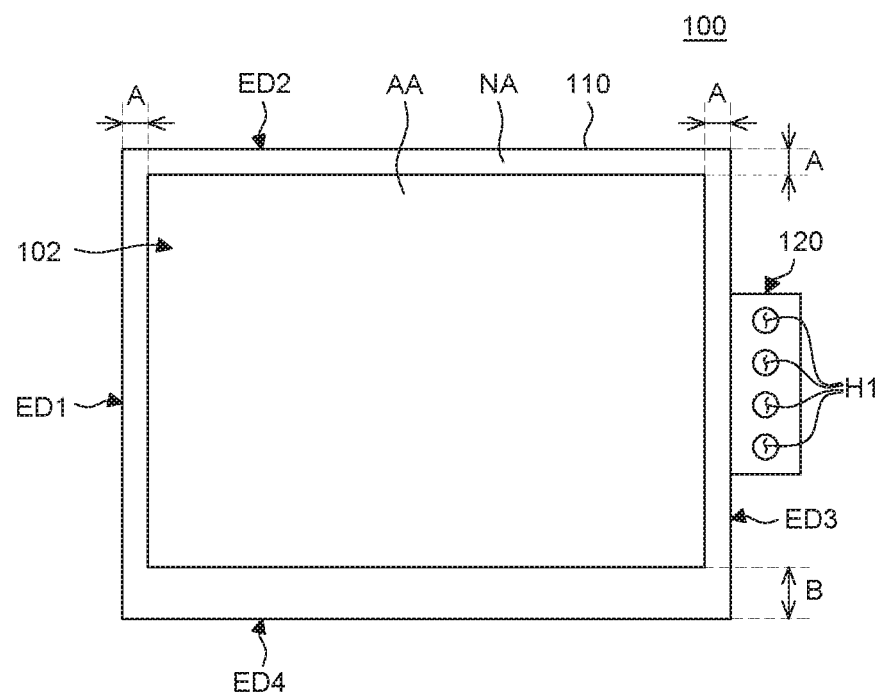
FIG. 1A is a front view of a display device according to one embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the content and the scope of the present disclosure. Therefore, the present disclosure will be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

A size and a thickness of each component illustrated in the drawing is for convenience only, and the present disclosure is not limited to the size and the thickness of the component illustrated, unless otherwise specified.

The features of various embodiments of the present disclosure can be partially or entirely adhered to or combined with each other and can be interlocked and operated in technically various ways, and the embodiments can be carried out independently of or in association with each other.

Hereinafter, embodiments of the present disclosure will be described in detail with reference to accompanying drawings.

Figure 1B:
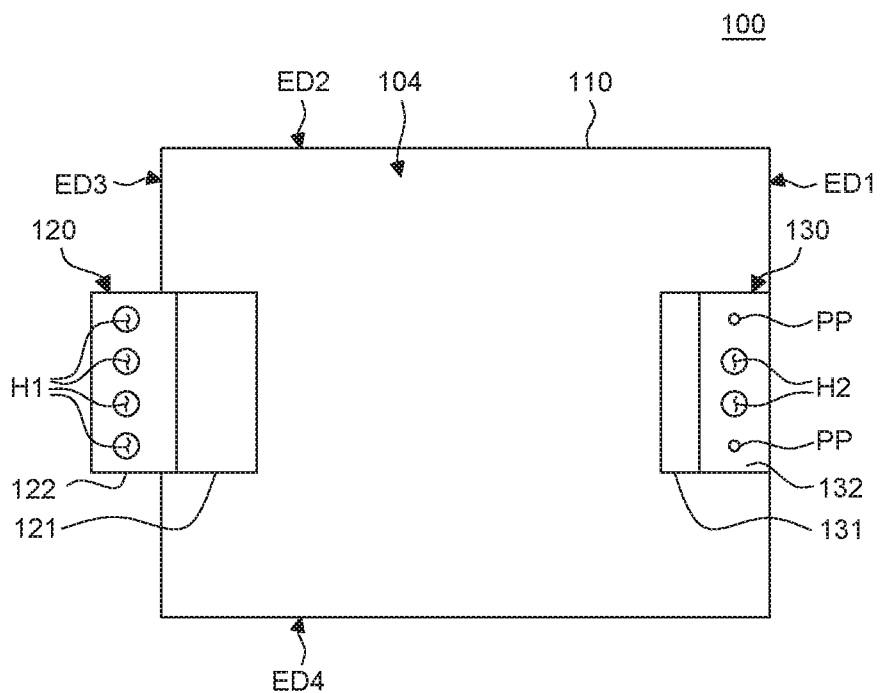
FIG. 1B is a rear view of the display device of FIG. 1A.

FIG. 1A is a front view of a display device 100 according to one embodiment of the present disclosure. FIG. 1B is a rear view of the display device 100 Referring to FIGS. 1A and 1B, the display device 100 includes a display panel 110 having a first surface 102 opposite a second surface 104, a first coupling device or element or assembly 120 (which may be referred to herein as a first coupling unit 120) coupled to the display device 100, and a second coupling device or element or assembly 130 (which may be referred to herein as a second coupling unit 130) coupled to the display device 100. The first surface 102 of the display panel 110 may be referred to herein as a front surface 102 of the display panel 110 and the second surface 104 of the display panel may be referred to herein as a rear surface 104 of the display panel 110.

The display panel 110 is configured to display images to a user. For example, the display panel 110 includes display elements and circuits, wiring lines, and components for driving the display elements. The display element includes different components depending on a type of the display panel 110. For example, when the display panel 110 is an organic light emitting display panel, the display element may be an organic light emitting diode which includes an anode, an organic light emitting layer, and a cathode. For example, when the display panel 110 is a liquid crystal display panel, the display element may be a liquid crystal display element.

The display panel 110 includes a display area AA and a non-display area NA.

The display area AA is an area where a plurality of pixels display images. Each of the pixels include an emission area for displaying images and a driving circuit for driving the pixels.

The non-display area NA encloses the display area AA. In other words, the non-display area NA surrounds the display area AA or extends along an entire perimeter edge of the display area AA. No images are displayed in the non-display area NA. Rather, the non-display area NA includes various wiring lines, driver integrated circuits (ICs), and printed circuit boards, among other components, for driving the pixels and the driving circuits disposed in the display area AA. More specifically, in one embodiment, the non-display area NA includes various ICs, such as a gate driver IC and a data driver IC.

As described above, in one embodiment, the driver IC and the printed circuit board are disposed in the non-display area NA. Each of the driver IC and the printed circuit board have a certain size and shape and as such, the non-display area NA has a certain area corresponding to the size or area of the driver IC and the printed circuit board. The portion of the non-display area NA housing the driver IC and the printed circuit board may be larger than the non-display area NA on other portions of the display device 100. For example, when a driver IC and a printed circuit board are mounted in the non-display area NA proximate or adjacent a fourth edge ED4 of the display device 100, a width B of the non-display area NA at the fourth edge ED4 is greater than widths A of the non-display areas NA at a first edge ED1, a second edge ED2, and a third edge ED3. Here, the first edge ED1 and the third edge ED3 are edges at a short side of the display panel 110 and the second edge ED2 and the fourth edge ED4 are edges at a long side of the display panel 110.

In other words, in one embodiment, the width A of the non-display area NA at the first edge ED1, the second edge ED2, and the third edge ED3 is less than the width B of the non-display area NA at the fourth edge ED4. For example, when the width of the non-display area NA at the first edge ED1, the second edge ED2, and the third edge ED3 is defined as A and the width of the non-display area NA at the fourth edge ED4 is defined as B, the width or dimension A is preferably a smaller value than the width or dimension B. Therefore, in one embodiment, the widths of the non-display area NA at the first edge ED1, the second edge ED2, and the third edge ED3 of the display panel 110 are the same. The width of the non-display area NA at the fourth edge ED4 is larger than the widths of the non-display area NA at the first edge ED1, the second edge ED2, and the third edge ED3. In other embodiments, each of the widths A, B are equal, or the widths A are greater than the width B. In one embodiment, the width of the non-display area NA proximate each of the edges ED1, ED2, ED3, ED4 are all the same or are all different, or some are the same while others are different.

Further, a black matrix is disposed in the non-display area NA and preferably covering the non-display area NA. As noted above, various wiring lines and circuits, which are formed of a metal material, are in the non-display area NA and thus reflectance of the non-display area NA for external light may be higher than that of the display area AA. When the reflectance for the external light in the non-display area NA is high, a glaring phenomenon may be caused. Further, light emitted from the display area AA reflected to the non-display area NA may cause light leakage. Therefore, the black matrix, which is formed of a black-based pigment, is provided the non-display area NA so that various wiring lines or driver ICs in the non-display area NA may not be visibly recognized. In other words, the black matrix reduces reflectance and light leakage caused by the components in the non-display area NA. More specifically, external light is not reflected, but rather is absorbed by the black matrix to reduce the glaring phenomenon. Further, the black matrix blocks light emitted from the display area AA, such that the light does not pass through the non-display area NA to the outside, thereby reducing light leakage.

Referring to FIG. 1B, a plurality of coupling elements, structures, or assemblies 120 and 130 (which may be referred to herein as a plurality of coupling units 120, 130 and first and second coupling units 120, 130, respectively) are disposed on the rear surface 104 of the display panel 110. The plurality of coupling units 120 and 130 includes a first coupling unit 120 and a second coupling unit 130.

The first coupling unit 120 and the second coupling unit 130 are connection members which couple the display panel 110 of the display device 100 to a display panel of another adjacent display device. The first coupling unit 120 and the second coupling unit 130 are coupled to a second coupling unit and a first coupling unit disposed in a display panel of another display device, respectively, such that the coupling units of adjacent display panels 110 are fixed together, as described herein.

That is, the first coupling unit 120 and the second coupling unit 130 are disposed on the rear surface 104 of the display panel 110 to connect a plurality of display devices 100 and implement a multi-panel display device having a larger display area that single panel display devices. The multi-panel display device implemented by the first coupling unit 120 and the second coupling unit 130 will be described in detail with reference to FIGS. 4 to 6.

The first coupling unit 120 is disposed on the rear surface 104 of the display panel 110 adjacent to the third edge ED3. The first coupling unit 120 includes a first base plate 121 and a hinge plate 122 in which a plurality of first fastening holes H1 are formed extending through the hinge plate 122.

The second coupling unit 130 is disposed on the rear surface 104 of the display panel 110 adjacent to the first edge ED1. The second coupling unit 130 includes a second base plate 131 and a fixing plate 132 in which a plurality of second fastening holes H2 are formed extending through the fixing plate 132. A plurality of protrusions PP extend from the fixing plate 132.

Hereinafter, the first coupling unit 120 and the second coupling unit 130 will be described in more detail with reference to FIGS. 2 and 3.

Figure 2:
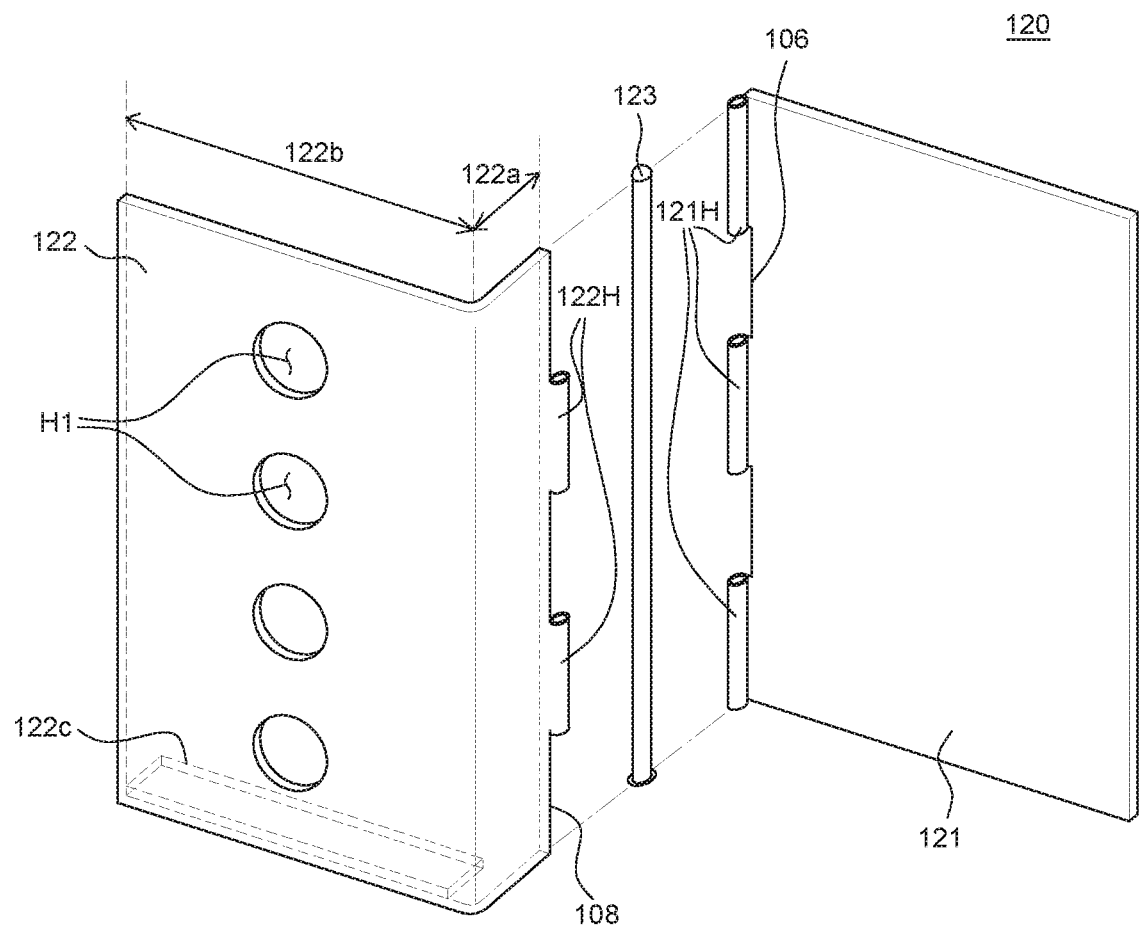
FIG. 2 is an exploded perspective view of a first coupling unit of the display device of FIG. 1B.

FIG. 2 is an exploded perspective view of the first coupling unit 120 of the display device 100. The first coupling unit 120 includes the first base plate 121, the hinge plate 122, and a hinge shaft 123.

The first base plate 121 is coupled or fixed to the rear surface 104 of the display panel 110. More specifically, the first base plate 121 is coupled or fixed to the rear surface 104 of the display panel 110 such that the first coupling unit 120 is coupled or fixed to the display panel 110.

A hinge barrel 121H, which may be referred to herein as a hinge shaft coupling unit 121H, of the first base plate 121 is disposed at a first edge 106 (which may be referred to herein as one edge 106) of the first base plate 121. The hinge shaft coupling unit 121H of the first base plate 121 is rotatably coupled to the hinge shaft 123. In other words, the hinge shaft 123 is received in an axial bore extending through the hinge shaft coupling unit 121H. However, since the first base plate 121 is fixed to the rear surface 104 of the display panel 110, the display panel 110 rotates about the hinge shaft 123, as well as the first base plate 121.

The hinge plate 122 is rotatably coupled to the hinge shaft 123. The hinge plate 122 is not fixed to the rear surface of the display panel 110, such that the hinge plate 122 may freely rotate around the hinge shaft 123.

A hinge barrel 122H, which may be referred to herein as a hinge shaft coupling unit 122H, of the hinge plate 122 is disposed at a first edge 108 (which may be referred to herein as the other edge 108) of the hinge plate 122. The hinge shaft coupling unit 122H of the hinge plate 122 is rotatably coupled to the hinge shaft 123. In other words, the hinge shaft 123 is received in a longitudinal axial bore extending through the hinge shaft coupling unit 122H. Specifically, the hinge shaft 123 is received in the hinge shaft coupling unit 121H and the hinge shaft coupling unit 122H to align and rotatably couple the hinge plate 122 and the first base plate 121 together.

In the meantime, the hinge plate 122 includes a first portion 122a, a second portion 122b, and a third portion 122c. Each of the portions 122a, 122b, and 122c may be referred to herein as first, second, and third parts 122a, 122b, 122c, respectively.

The first part 122a of the hinge plate 122 extends from the hinge shaft coupling unit 122H of the hinge plate 122 proximate the first edge 108 of the hinge plate 122.

The second part 122b of the hinge plate 122 is at an angle to the first part 122a and extends from the first part 122a of the hinge plate 122. Specifically, the second part 122b of the hinge plate 122 extends from an edge which is opposite to the edge first 108 where the hinge shaft coupling unit 122H of the first part 122a is disposed. Further, in one embodiment, the second part 122b of the hinge plate 122 is disposed perpendicular relative to one surface of the first part 122a of the hinge plate 122. Therefore, a portion of the hinge plate 122 including the first part 122a and the second part 122b has an L shape, in an embodiment.

The plurality of first fastening holes H1 are disposed in the second part 122b of the hinge plate 122 and extending through the second part 122b. The plurality of first fastening holes H1 are preferably holes into which a fixing member or other fastener is inserted to couple and fix the first coupling unit 120 and the second coupling unit of another display panel to each other. Detailed description thereof is provided below with reference to FIGS. 7A to 7C.

Further, in FIG. 2, even though it is illustrated that the plurality of first fastening holes H1 includes four holes of the same size and shape, the number of first fastening holes H1 and the shape thereof are not limited thereto.

The third part 122c of the hinge plate 122 is bent to extend from the second part 122b of the hinge plate 122. Specifically, the third part 122c of the hinge plate 122 is bent to extend from one edge among a plurality of edges of the second part 122b of the hinge plate 122. In one embodiment, the one edge is an upper or lower edge of the second part 122b. For example, in one embodiment, the third part 122c of the hinge plate 122 extends from a lower edge among the plurality of edges of the second part 122b of the hinge plate 122, as shown in FIG. 2. Further, in one embodiment, the third part 122c of the hinge plate 122 is disposed perpendicular to one surface of the first part 122a and the second part 122b of the hinge plate 122. Therefore, another portion of the hinge plate 122 including the second part 122b and the third part 122c has an L shape that is oriented different from the portion described above.

Although FIG. 2 illustrates that the third part 122c extends from the lower edge of the second part 122b, in other embodiments, the third part 122c extends from any one of the other plurality of edges of the second part 122b, and as such, the location of the third part 122c is not limited.

Figure 3:
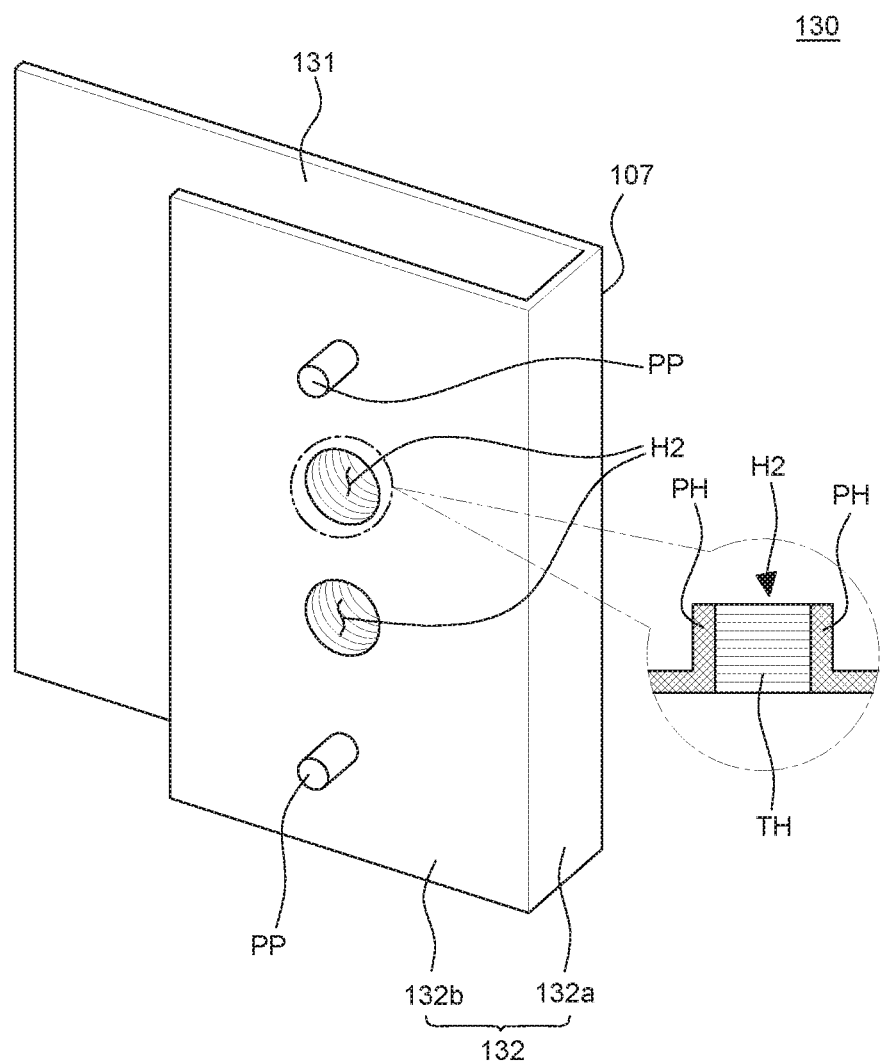
FIG. 3 is a perspective view of a second coupling unit of the display device of FIG. 1B.

FIG. 3 is a perspective view of the second coupling unit 130 of the display device 100. Referring to FIG. 3, the second coupling unit 130 includes a second base plate 131 and a fixing plate 132.

The second base plate 131 is fixed or coupled to the rear surface 104 of the display panel 110. In other words, the second base plate 131 is fixed to the rear surface 104 of the display panel 110 so as to be fixed or coupled to the display panel 110.

The fixing plate 132 extends from a first edge 107 (which may be referred to herein as one edge 107) of the second base plate 131. The fixing plate 132 includes a first portion 132a and a second portion 132b as well as a plurality of second fastening holes H2, fixing units PH, and protrusions PP. The first portion 132a and the second portion 132b of the fixing plate 132 may be referred to herein as a first part 132a and a second part 132b, respectively.

The first part 132a of the fixing plate 132 extends from the second base plate 131 at an angle to the second base plate 131. Specifically, the first part 132a of the fixing plate 132 extends from the first edge of the second base plate 131. Further, in one embodiment, the first part 132a of the fixing plate 132 is bent to be disposed perpendicularly to one surface of the second base plate 131, such that the first part 132a and the second base plate 131 form an L shape with a 90 degree angle therebetween.

The second part 132b of the fixing plate 132 is extends from the first part 132a of the fixing plate 132. Specifically, the second part 132b of the fixing plate 132 extends from an edge of the first part 132a of the fixing plate 132 opposite the first edge 107. Further, the second part 132b of the fixing plate 132 is disposed in a bent configuration to be parallel to one surface of the second base plate 131 and perpendicular to the first part 132a. Therefore, the fixing plate 132, which includes the first part 132a and the second part 132b, also has an L shape that is a mirror image of the L shape between the second base plate 131 and the first part 132a.

Further, since the L shaped fixing plate 132 preferably extends from the second base plate 131 at a 90 degree angle to the second base plate 131, the second coupling unit 130 has a U shape.

In the meantime, the plurality of second fastening holes H2 are disposed in the second part 132b of the fixing plate 132 and extending through the second part 132b. The plurality of second fastening holes H2 may be holes into which a coupling member or other fastener is received to couple and fix the second coupling unit 130 and a first coupling unit of another display panel to each other.

For example, the plurality of second fastening holes H2 are configured to communicate with two first fastening holes H1 disposed between uppermost and lowermost first fastening holes H1 among the four first fastening holes H1 of the first coupling unit 120 illustrated in FIG. 2. Therefore, a coupling member or other fastener is inserted into the two first fastening holes H1 disposed between the uppermost and the lowermost first fastening holes H1 and the plurality of second fastening holes H2 to fix the first coupling unit 120 and the second coupling unit 130. In other words, when the first coupling unit 120 of one display panel is coupled to the second coupling unit 130 of an adjacent display panel, the plurality of fastening holes H2 align with at least holes H1 of the first coupling unit 120 to receive fasteners to secure the first coupling unit 120 to the second coupling unit 130.

A fixing protrusion PH (which may be referred to herein as a fixing unit PH) communicates with the plurality of second fastening holes H2. Specifically, the fixing unit PH protrudes from one surface of the second part 132b of the fixing plate 132. As such, the fixing unit PH is disposed on one surface of the second part 132b which is opposite to the second base plate 131. In one embodiment, each fixing unit PH includes one fastening hole H2 with a plurality of screw threads extending from or into a surface of the fixing unit PH. Because the fastening holes H2 communicate with the plurality of first fastening holes H1, a threaded fastener can be received through one of the first fastening holes H1 and secured to the screw threads of the second fastening hole H2 in the fixing unit PH.

As such, the fixing unit PH is a member which can secure a coupling member or other fastener inserted into the plurality of second fastening holes H2. For example, when the coupling member is a screw having a screw thread, the fixing unit PH has a screw thread TH on an inner circumferential surface so that the screw may be inserted into the fixing unit PH and fixed to the fixing unit PH via the threads of the fastener and the screw thread TH of the fixing unit PH. However, even though FIG. 3 illustrates the fixing unit PH having a screw thread TH on an inner circumferential surface to be fastened with the coupling member, the fixing unit PH may vary in design depending on a shape and a type of the coupling member and is therefore not limited thereto to the illustrated configuration.

A plurality of protrusions PP extend from a surface of the second part 132b. When the second coupling unit 130 and the first coupling unit 130 of another display panel are coupled to each other, the plurality of protrusions PP are received into at least one of the plurality of first fastening holes H1 of the first coupling unit 120 of another display panel. The plurality of protrusions PP are inserted into the plurality of first fastening holes of the first coupling unit of another display panel such that the second coupling unit 130 and the first coupling unit of another display panel are fixed or coupled together.

For example, the plurality of protrusions PP are configured to be inserted into uppermost and lowermost first fastening holes H1 among the four first fastening holes H1 of the first coupling unit 120 illustrated in FIG. 2. Therefore, the plurality of protrusions PP are inserted into the uppermost and lowermost first fastening holes H1 such that the first coupling unit 120 and the second coupling unit 130 are fixed.

Even though FIG. 3 illustrates two second fastening holes H2 and two protrusions PP, the number of the plurality of second fastening holes H2 and the number of the plurality of protrusions PP and the shapes thereof are not limited thereto.

Further, in FIG. 3, it is illustrated that the plurality of protrusions PP are disposed at the uppermost side and the lowermost side and the plurality of second fastening holes H2 are disposed between the plurality of protrusions PP. However, in other embodiments, the plurality of protrusions PP and the plurality of second fastening holes H2 may be alternately disposed or the plurality of second fastening holes H2 may be disposed at the uppermost side and the lowermost side and the plurality of protrusions PP may be disposed between the plurality of second fastening holes H2. That is, as long as the plurality of protrusions PP and the plurality of second fastening holes H2 are disposed so as to correspond to the plurality of first fastening holes H1, the arrangement of the plurality of protrusions PP and the plurality of second fastening holes H2 may be selected according to applications of the coupling units 120, 130, and are not limited to the illustrated embodiments.

Further, in accordance with the arrangement of the plurality of protrusions PP and the plurality of second fastening holes H2, the position of the coupling member into which the plurality of first fastening holes H1 and the plurality of second fastening holes H2 are simultaneously inserted may also be selected and is there not limited.

Hereinafter, a multi-panel display device which is implemented by connecting a plurality of display devices will be described with reference to FIGS. 4 to 6.

Figure 4:
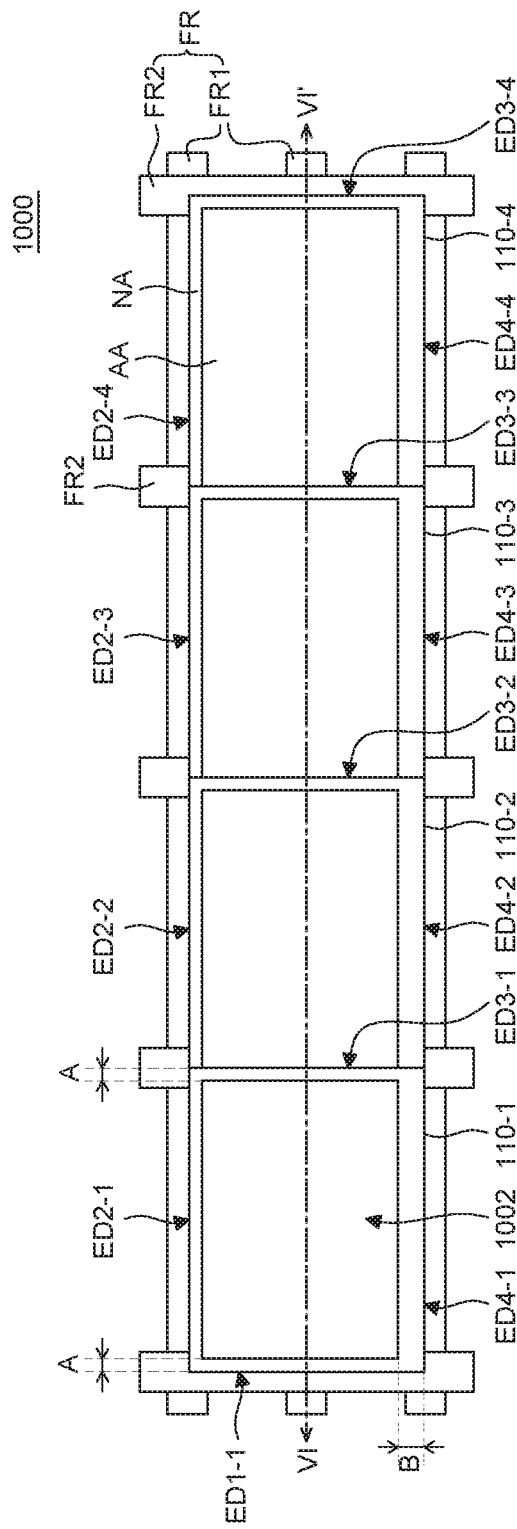
FIG. 4 is a front view of a multi-panel display device according to one embodiment of the present disclosure.

FIG. 4 is a front view of a multi-panel display device 1000 according to one embodiment of the present disclosure. The multi-panel display device 1000 includes a first surface 1002 (which may be referred to herein as a front surface 1002) opposite a second surface 104 (which may be referred to herein as a rear surface 1002). FIG. 4 illustrates the front surface 1002 of the device 1000. FIG. 5 is a rear view of the multi-panel display device 1000 illustrating the rear surface 1004. FIG. 6 is a cross-sectional view of the multi-panel display device 1000 taken along the line VI-VI' in FIG. 4. The multi-panel display device 1000 of FIGS. 4 to 6 is implemented by connecting or coupling a plurality of display devices 100 to each other. The plurality of display devices 100 comprising the multi-panel display device 1000 are the same as the display device 100 of FIGS. 1 to 3, and as such, redundant description will be omitted. To avoid any confusion in the following description, a frame FR disposed on the rear surface 1004 of the plurality of display panels 110-1, 110-2, 110-3, and 110-4 is omitted in FIG. 5.

Figure 5:
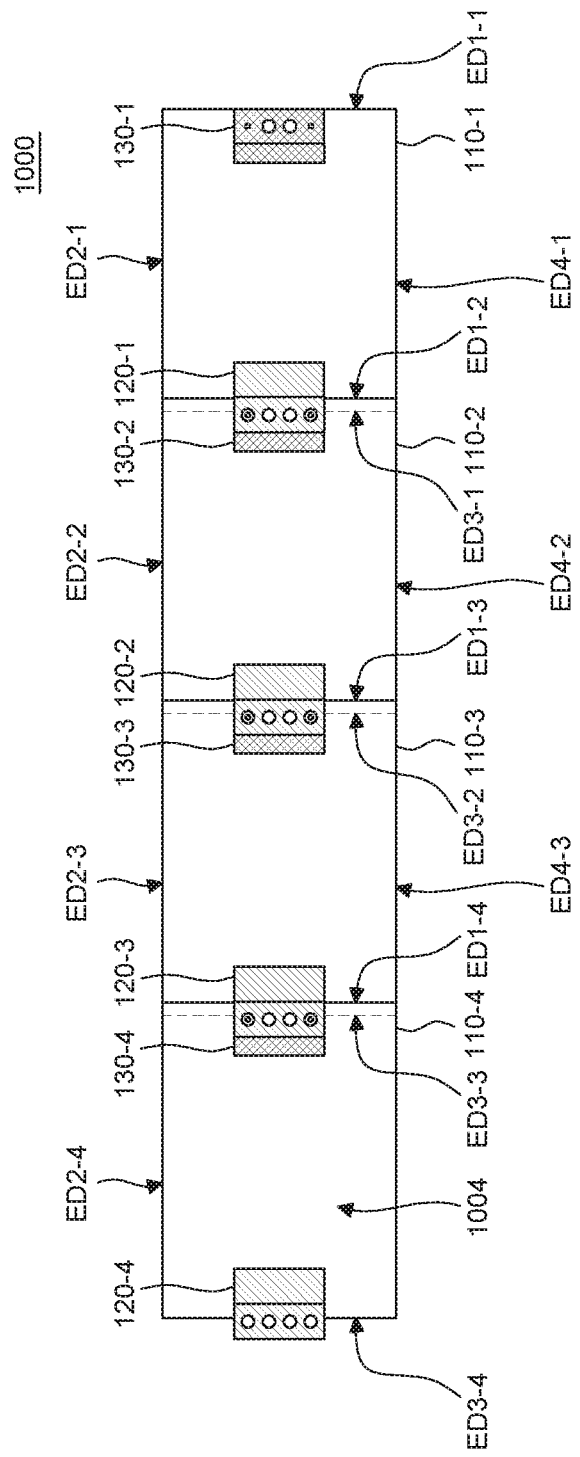
FIG. 5 is a rear view of the multi-panel display device of FIG. 4.
Figure 6:
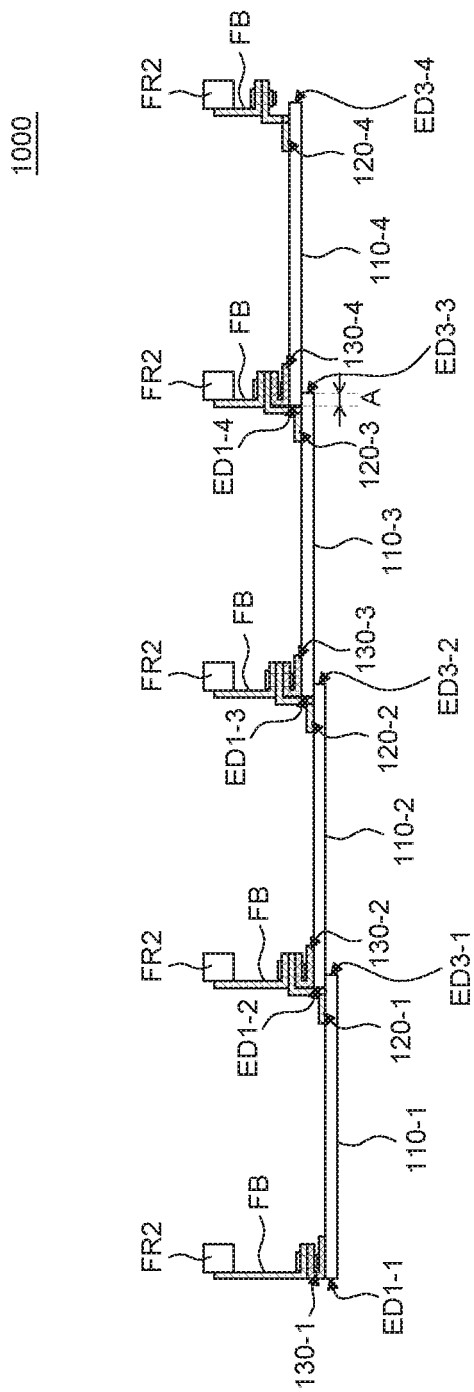
FIG. 6 is a cross-sectional view of the multi-panel display device of FIG. 4.

First, in FIGS. 4 to 6, the illustrated embodiment of the multi-panel display device 1000 includes four display panels 110-1, 110-2, 110-3, and 110-4 and it is assumed that a first display panel 110-1, a second display panel 110-2, a third display panel 110-3, and a fourth display panel 110-4 are sequentially disposed from a leftmost side. However, other embodiments include more or less than four panels. For example, the device 1000 may include five, ten, fifteen, twenty, thirty, or more panels. As such, the present disclosure is not limited by the number of panels in the device 1000.

The first display panel 110-1, the second display panel 110-2, the third display panel 110-3, and the fourth display panel 110-4 are connected to each other or coupled to each other to the multi-panel display device 1000. In other words, the device 1000 is an array of a plurality of panels, such as panels 110-1, 110-2, 110-3, and 110-4.

Referring to FIG. 4, the frame FR is disposed on the rear surface 1004 of the plurality of display panels 110-1, 110-2, 110-3, and 110-4. The frame FR includes a first frame FR1 and a second frame FR2 to support the plurality of display panels 110-1, 110-2, 110-3, and 110-4. The frame FR is preferably a structure onto which the plurality of display panels 110-1, 110-2, 110-3, and 110-4 are installed or coupled.

The first frame FR1 is disposed parallel to a second edge ED2 and a fourth edge ED4. The second frame FR2 is disposed parallel to a first edge ED1 and a third edge ED3. The first frame FR1 and the second frame FR2 fixed or coupled to each other, such as with fasteners. For example, the first frame FR1 and the second frame FR2 are fixed at a crossing point to form a lattice shape, wherein the first frame FR1 and the second frame FR2 support each other.

The first display panel 110-1, the second display panel 110-2, the third display panel 110-3, and the fourth display panel 110-4 are connected such that edges of each panel overlap each other. For example, the first display panel 110-1 is disposed adjacent to the second display panel 110-2. A third edge ED3-1 of the first display panel 110-1 overlaps a first edge ED1-2 of the second display panel 110-2. The second display panel 110-2 is disposed adjacent to the third display panel 110-3. A third edge ED3-2 of the second display panel 110-2 overlaps a first edge ED1-3 of the third display panel 110-3. The third display panel 110-3 is disposed adjacent to the fourth display panel 110-4. A third edge ED3-3 of the third display panel 110-3 overlaps a first edge ED1-4 of the fourth display panel 110-4. Therefore, a part of the non-display area of each panel may not be visible to a user when viewing the panels in the orientation shown in FIG. 4.

Referring to FIG. 4, when the multi-panel display device 1000 is seen from the front surface 1002, all non-display areas NA of the first edge ED1-1, the second edge ED2-1, the third edge ED3-1, and the fourth edge ED4-1 of the first display panel 110-1 are visible, or in other words, are in front of adjacent panels such that they are visible to a user.

When the multi-panel display device 1000 is seen from the front surface 1002, only non-display areas NA of the second edge ED2-2, the third edge ED3-2, and the fourth edge ED4-2 of the second display panel 110-2 are visible, in an embodiment. As such, the non-display area NA at the first edge ED1-2 of the second display panel 110-2 is not visible.

When the multi-panel display device 1000 is viewed from the front surface 1002, only non-display areas NA of the second edge ED2-3, the third edge ED3-3, and the fourth edge ED4-3 of the third display panel 110-3 are visible, in an embodiment. The non-display area NA at the first edge ED1-3 of the third display panel 110-3 is not visible.

When the multi-panel display device 1000 is seen from the front surface 1002, only non-display areas NA of the second edge ED2-4, the third edge ED3-4, and the fourth edge ED4-4 of the fourth display panel 110-4 are visible. The non-display area NA in the first edge ED1-4 of the fourth display panel 110-4 is not visible.

Therefore, the width of the non-display area NA which is visible at a boundary between the first display panel 110-1 and the second display panel 110-2 is a dimension A. The width of the non-display area NA which is visible at a boundary between the second display panel 110-2 and the third display panel 110-3 is the dimension A. Further, the width of the non-display area NA which is visible at a boundary between the third display panel 110-3 and the fourth display panel 110-4 is the dimension A. As such, each of these areas may be equal, or they may be different, in other embodiments.

Referring to FIG. 5, when the multi-panel display device 1000 is seen from the rear surface 1004, the first display panel 110-1 and the second display panel 110-2 are disposed adjacent to each other. As such, the third edge ED3-1 of the first display panel 110-1 is behind the first edge ED1-2 of the second display panel 110-2. Therefore, only the first edge ED1-2 of the second display panel 110-2 is visible when viewing the device 1000 from the rear surface 1002 of the multi-panel display device 1000.

Further, the second display panel 110-2 and the third display panel 110-3 are disposed adjacent to each other and as such, the third edge ED3-2 of the second display panel 110-2 is behind the first edge ED1-3 of the third display panel 110-3. Therefore, only the first edge ED1-3 of the third display panel 110-3 is visible on the rear surface 1004 of the multi-panel display device 1000.

In the illustrated embodiment, the third display panel 110-3 and the fourth display panel 110-4 are disposed to be adjacent to each other. Thus, the third edge ED3-3 of the third display panel 110-3 is behind the first edge ED1-4 of the fourth display panel 110-4. Therefore, only the first edge ED1-4 of the fourth display panel 110-4 is visible on the rear surface of the multi-panel display device 1000.

In this case, each of the plurality of display panels 110-1, 110-2, 110-3, and 110-4 are coupled together by the first coupling unit 120 and the second coupling unit 130, which are fixed to each other.

For example, a first coupling unit 120-1 of the first display panel 110-1 is coupled to a second coupling unit 130-2 of the second display panel 110-2 such that the coupling units 120-1, 130-2 and the display panels 110-1, 110-2 are fixed to each other. Therefore, the first display panel 110-1 and the second display panel 110-2 are connected by the first coupling unit 120-1 of the first display panel 110-1 and the second coupling unit 130-2 of the second display panel 110-2.

A first coupling unit 120-2 of the second display panel 110-2 is coupled to a second coupling unit 130-3 of the third display panel 110-3 such that the coupling units 120-2, 130-3 and the display panels 110-2, 110-3 are fixed or coupled to each other. Therefore, the second display panel 110-2 and the third display panel 110-3 are connected by the first coupling unit 120-2 of the second display panel 110-2 and the second coupling unit 130-3 of the third display panel 110-3.

A first coupling unit 120-3 of the third display panel 110-3 is coupled to a second coupling unit 130-4 of the fourth display panel 110-4 such that the coupling units 120-3, 130-4 and the display panels 110-3, 110-4 are fixed to each other. Therefore, the third display panel 110-3 and the fourth display panel 110-4 connected by the first coupling unit 120-3 of the third display panel 110-3 and the second coupling unit 130-4 of the fourth display panel 110-4.

Referring to FIG. 6, the first coupling units 120-1, 120-2, 120-3, and 120-4 and the second coupling unit 130-1, 130-2, 130-3, and 130-4 are fixed to the frame FR by an auxiliary bracket FB.

In one embodiment, only the second coupling unit 130-1 is coupled to the auxiliary bracket FB to fix the second coupling unit 130-1 to the second frame FR2 at the first edge ED1-1 of the first display panel 110-1.

The first coupling unit 120-1 of the first display panel 110-1 and the second coupling unit 130-2 of the second display panel 110-2 are likewise coupled to the auxiliary bracket FB so as to be fixed to the second frame FR2.

The first coupling unit 120-2 of the second display panel 110-2 and the second coupling unit 130-3 of the third display panel 110-3 are similarly coupled to the auxiliary bracket FB and fixed to the second frame FR2.

The first coupling unit 120-3 of the third display panel 110-3 and the second coupling unit 130-4 of the fourth display panel 110-4 are similarly coupled to the auxiliary bracket FB and fixed to the second frame FR2.

In one embodiment, only the first coupling unit 120-4 is coupled to the auxiliary bracket FB so as to be fixed to the second frame FR2 at the third edge ED3-4 of the fourth display panel 110-4. In other words, only the coupling units 120-4 and 130-1 are coupled to the frame FR2 at outer edges ED1-1 and ED3-4 of the device 1000. The remaining coupling units are coupled along an interior of the device 1000 relative to the outer edges ED1-1 and ED3-4.

In one or more embodiments, the first coupling units 120-1, 120-2, 120-3, and 120-4 and the second coupling units 130-1, 130-2, 130-3, and 130-4 which connect the plurality of display panels 110-1, 110-2, 110-3, and 110-4 together are coupled to the auxiliary bracket FB or only the first coupling units 120-1, 120-2, 120-3, and 120-4 or the second coupling unit 130-1, 130-2, 130-3, and 130-4 are coupled to the auxiliary bracket FB so as to be coupled or fixed to the frame FR.

Even though FIG. 6 illustrates that the auxiliary bracket FB is coupled to the second frame FR2, in other embodiments, the auxiliary bracket FB is coupled to the first frame FR1, and as such, the auxiliary bracket FB is not limited to the illustrated embodiment.

When the plurality of display panels 110-1, 110-2, 110-3, and 110-4 are coupled together, the first coupling units 120-1, 120-2, 120-3, and 120-4 and the second coupling unit 130-1, 130-2, 130-3, and 130-4 precisely align the plurality of display panels 110-1, 110-2, 110-3, and 110-4 to reduce warpage between the plurality of display panels 110-1, 110-2, 110-3, and 110-4. Specifically, when the plurality of display panels 110-1, 110-2, 110-3, and 110-4 are coupled together, the plurality of display panels 110-1, 110-2, 110-3, and 110-4 are aligned and coupled such that the non-display areas NA are connected in a straight line at the second edges ED2-1, ED2-2, ED2-3, and ED2-4 and the fourth edges ED4-1, ED4-2, ED4-3, and ED4-4. However, during the process of coupling the plurality of display panels 110-1, 110-2, 110-3, and 110-4, when the plurality of display panels 110-1, 110-2, 110-3, and 110-4 are coupled together in a twisted configuration, the non-display areas NA are not connected in a straight line, but may be crooked. Further, when the display panels 110-1, 110-2, 110-3, and 110-4 are in the twisted configuration, the non-display areas NA at the first edges ED1-2, ED1-3, and ED1-4 which overlap the third edges ED3-1, ED3-2, and ED3-3 such that they are not visible from the front surface 1002 of the multi-panel display device 1000 will be visible from the front surface 1002 of the multi-panel display device 1000.

Hereinafter, a coupling process between the first coupling units 120-1, 120-2, 120-3, and 120-4 and the second coupling units 130-1, 130-2, 130-3, and 130-4 to align the plurality of display panels 110-1, 110-2, 110-3, and 110-4 will be described in detail with reference to FIGS. 7A to 7C.

Figure 7A:
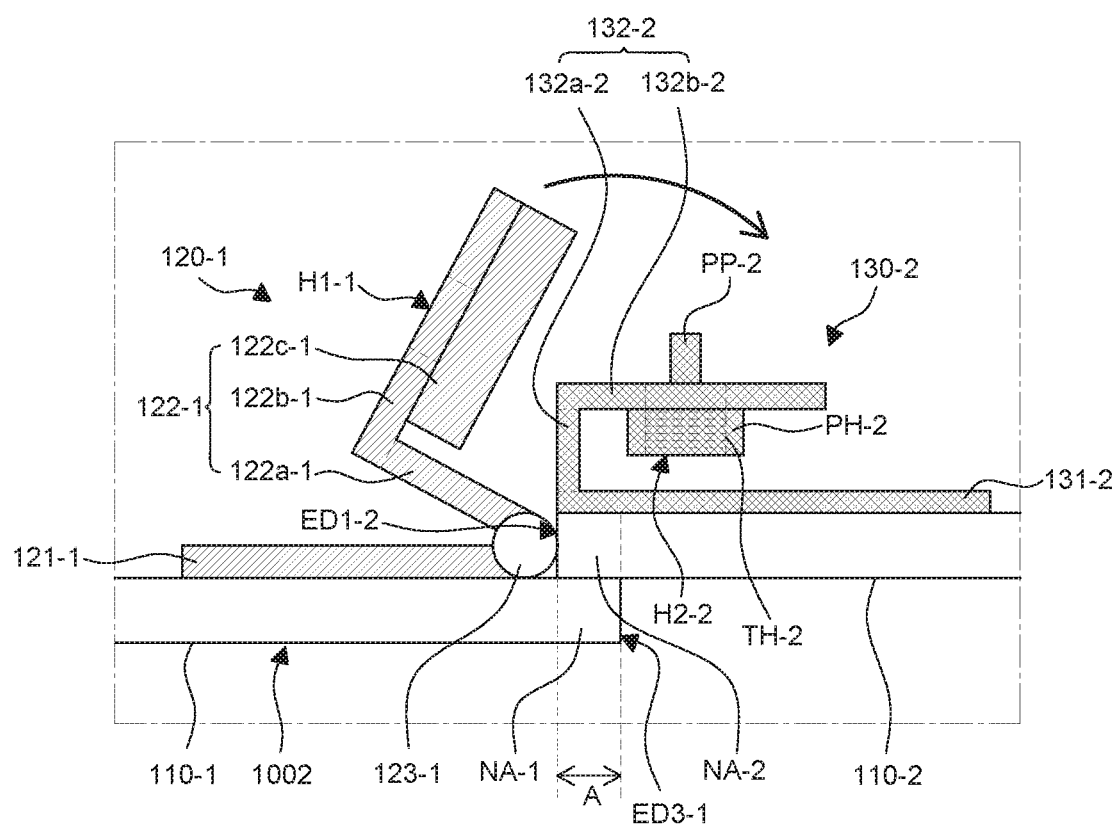
FIGS. 7A to 7C are schematic enlarged cross-sectional views for explaining a coupling process of a first coupling unit and a second coupling unit of the multi-panel display device of FIG. 5.
Figure 7B:
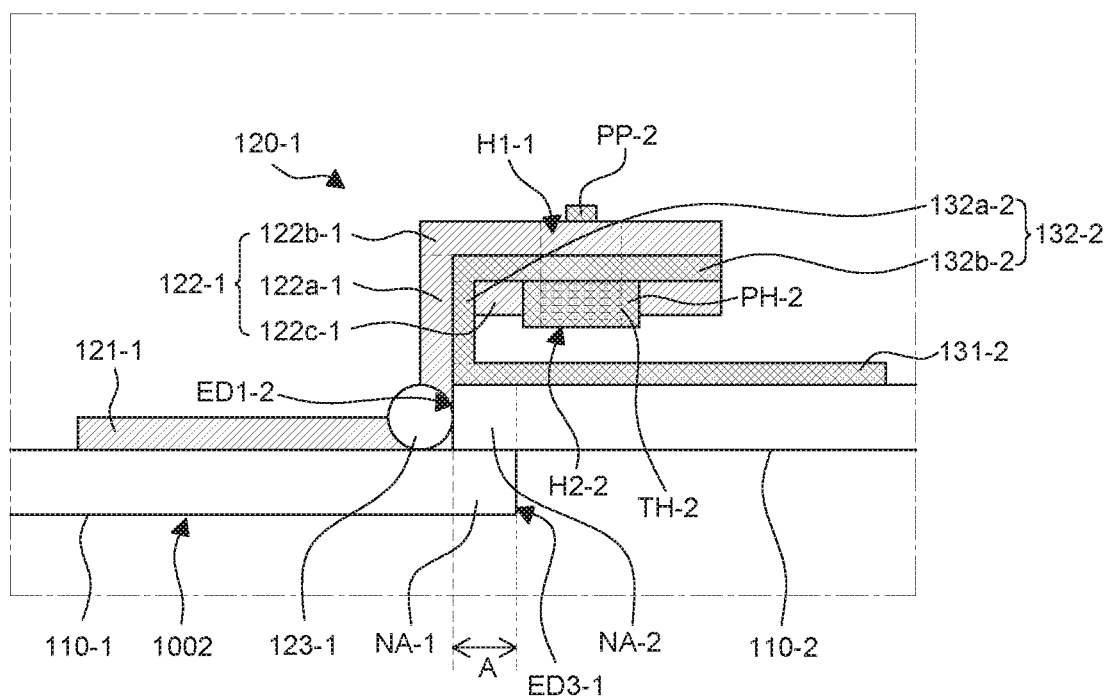
Figure 7C:
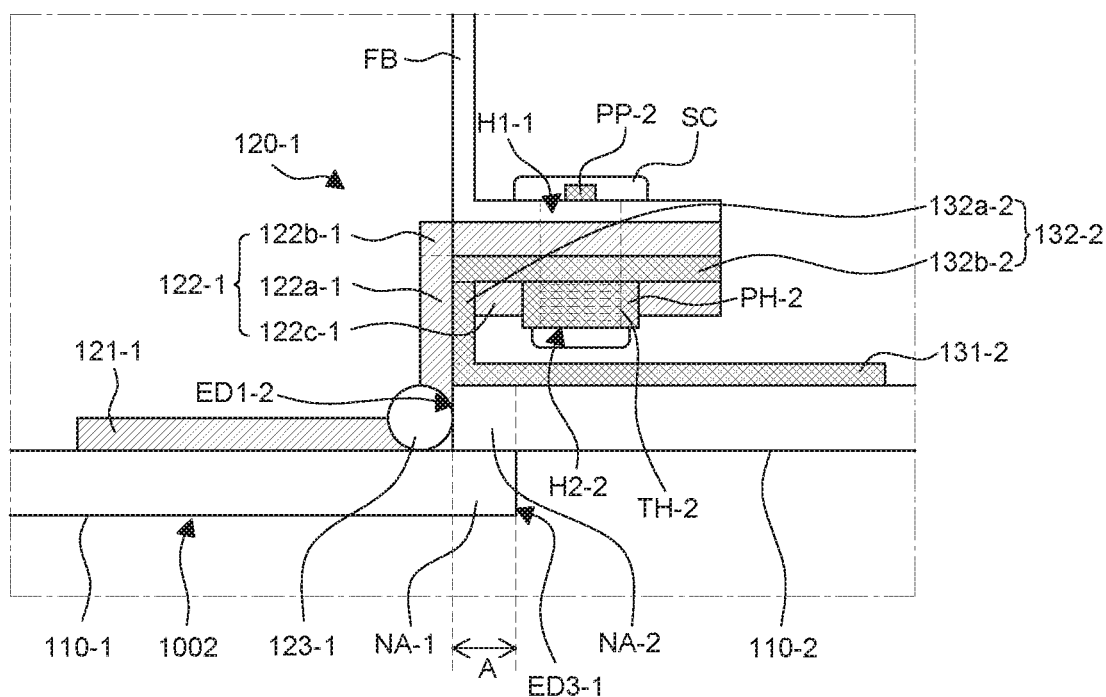

FIGS. 7A to 7C are schematic enlarged cross-sectional views for explaining a coupling process of a first coupling unit and a second coupling unit of a multi-panel display device according to an exemplary embodiment of the present disclosure. FIGS. 7A to 7C are cross-sectional views of portions of the device 1000 wherein the coupling units have been enlarged for clarity. While FIGS. 7A to 7C only illustrate the coupling process of the first coupling unit 120-1 of the first display panel 110-1 and the second coupling unit 130-2 of the second display panel 110-2, it is to be appreciated the coupling between the other coupling units described herein is the same.

Referring to FIG. 7A, the side of the second display panel 110-2 is in contact with the hinge shaft 123-1 of the first coupling unit 120-1 of the first display panel 110-1. As such, the hinge shaft 123-1 prevents the second display panel 110-2 from moving closer to the first display panel 110-1. Therefore, the hinge shaft 123-1 of the first coupling unit 120-1 guides the display panels 110-1, 110-2 into a coupling position such that the non-display area NA-2 of the second display panel 110-2 overlaps a portion of a rear surface and the non-display area NA-1 of the first display panel 110-1.

The hinge shaft 123-1 of the first coupling unit 120-1 is disposed inside the first display panel 110-1 from the third edge ED3-1. Since the hinge shaft 123-1 is disposed in spaced relationship from the third edge ED3-1 of the first display panel 110-1, the side of the second display panel 110-2 is disposed in contact with the hinge shaft 123-1. The non-display area NA-2 of the second display panel 110-2 at the first edge ED1-2 is disposed in contact with the rear surface of the first display panel 110-1.

Further, when the non-display area NA-2 of the second display panel 110-2 is in contact with the rear surface of the first display panel 110-1, the first coupling unit 120-1 and the second coupling unit 130-2 are coupled to each other. Therefore, separate alignment of an entire side of the second display panel 110-2 and an entire side of the first display panel 110-1 such that the sides are in contact with each other is not necessary. Therefore, the rear surface of the first display panel 110-1 guides the coupling position of the second display panel 110-2.

Because preferably all of the non-display area NA-2 of the first edge ED1-2 of the second display panel 110-2 overlaps the non-display area NA-1 of the third edge ED3-1 of the first display panel 110-1, the width of the non-display area NA which is visible from the front surface 1002 of the multi-panel display device 1000 is equal to the dimension A. That is, even though the width of the non-display area NA of both the first display panel 110-1 and the second display panel 110-2 is equal to A, the first display panel 110-1 and the second display panel 110-2 are disposed, via the coupling units, such that the non-display areas NA overlap each other to reduce a visible width of the non-display areas NA of adjacent display panels. More specifically, the width of the non-display area NA that is visible from the front surface 1002 may be A, rather than 2 times A. Therefore, the width of the non-display area NA which is visible from the front surface 1000 of the multi-panel display device 1000 is reduced, that is, the size of the non-display area NA where no image is displayed is reduced so that the quality of the image displayed on the multi-panel display device 1000 may not be degraded. In one embodiment, the size of the non-display area NA is reduced by half, as one non-display area NA of each display panel is not visible.

Once the side of the second display panel 110-2 is in contact with the hinge shaft 123-1 of the first coupling unit 120-1, the hinge plate 122-1 of the first coupling unit 120-1 of the first display panel 110-1 rotates so as to cover the second coupling unit 130-2 of the second display panel 110-2. In other words, the hinge plate 122-1 of the first coupling unit 120-1 of the first display panel 110-1 rotates toward the second coupling unit 130-2 of the second display panel 110-2, as indicated by the arrow in FIG. 7A.

Next, referring to FIG. 7B, the hinge plate 122-1 of the first coupling unit 120-1 rotates to be positioned over the second coupling unit 130-2 of the second display panel 110-2. The hinge plate 122-1 is disposed to cover the fixing plate 132-2 of the second coupling unit 130-2 of the second display panel 110-2.

The first part 122*a*-1 of the hinge plate 122-1 is in contact with the first part 132*a*-2 of the fixing plate 132-2. The second part 122*b*-1 of the hinge plate 122-1 is in contact with the second part 132*b*-2 of the fixing plate 132-2. Further, the third part 122*c*-1 of the hinge plate 122-1 supports at least a portion of the first part 132*a*-2 of the fixing plate 132-2 and the entire second part 132*b*-2 of the fixing plate 132-2, from an upper portion or a lower portion.

That is, the third part 122c-1 of the hinge plate 122-1 may serve as a support element which supports the fixing plate 132-2. The third part 122c-1 of the hinge plate 122-1 may be referred to herein as a support plate.

Since the hinge plate 122-1 is disposed to cover the fixing plate 132-2, the third part 122c-1 of the hinge plate 122-1 supports the fixing plate 132-2 such that the fixing plate 132-2 is not able to move relative to the first coupling unit 120-1. Therefore, the third part 122c-1 of the hinge plate 122-1 of the first coupling unit 120-1 guides the second coupling unit 130-2 to prevent the second coupling unit 130-2 from uncoupling with the first coupling unit 120-1. For example, an upper side or a lower side of the first coupling unit 120-1 guides the first coupling unit 120-1 into a coupling position with the second coupling unit 130-2.

At least one of the plurality of first fastening holes H1-1 of the hinge plate 122-1 is aligned with the second fastening hole H2-2 of the fixing plate 132-2. Further, the protrusion PP-2 of the fixing plate 132-2 is inserted into the remaining first fastening holes H1-1 of the plurality of first fastening holes H1-1. Because the protrusion PP-2 is inserted into the first fastening hole H1-1, the plurality of first fastening holes H1-1 of the first coupling unit 120-1 and the second fastening hole H2-2 of the second coupling unit 130-2 are guided into alignment with each other. That is, the protrusion PP-2 is inserted into the first fastening hole H1-1 to fix the second coupling unit 130-2, which prevents the second coupling unit 130-2 from deviating from a coupling position with the first coupling unit 120-1, and as such, the protrusion PP-2 guides the first coupling unit 120-1 and the second coupling unit 130-2 into the coupling position.

Finally, referring to FIG. 7C, the auxiliary bracket FB is disposed in contact with the hinge plate 122-1. The screw SC is inserted into the auxiliary bracket FB, the hinge plate 122-1, and the fixing plate 132-2. The screw SC is fixed to the fixing unit PH-2 by the screw thread TH-2 of the fixing unit PH-2. In other words, the screw SC is inserted into the auxiliary bracket FB, the hinge plate 122-1, and the fixing plate 132-2 to couple the auxiliary bracket FB, the hinge plate 122-1, and the fixing plate 132-2 to each other.

However, even though FIG. 7C illustrates that the screw SC is fixed by the screw thread TH of the fixing unit PH-2, other embodiments of the fixing unit PH-2 include using a nut and bolt through the fixing unit PH-2, or other fastening devices and as such, the embodiments of the present disclosure are not limited to the illustrated embodiment.

Since the front surface of the second display panel 110-2 is in contact with the rear surface of the first display panel 110-1, the second display panel 110-2 is prevented from moving toward the first display panel 110-1. Further, the rear surface of the second display panel 110-2 is prevented from moving in a direction wherein the rear surface of the second display panel 1102 is positioned farther from the first display panel 110-1 by the first coupling unit 120-1, which is coupled or fixed to the second coupling unit 130-2. Therefore, the second display panel 110-2 is fixed such that there is no gap between the rear surface of the first display panel 110-1 and the front surface of the second display panel 110-2 by fixing the first coupling unit 120-1 and the second coupling unit 130-2. The coupling position of the second display panel 110-2 is guided by fixing the first coupling unit 120-1 and the second coupling unit 130-2 together, as above.

The multi-panel display device 1000 is assembled by coupling the plurality of display panels 110-1, 110-2, 110-3, and 110-4 to each other. Further, when the plurality of display panels 110-1, 110-2, 110-3, and 110-4 are coupled, their respective coupling positions are guided and aligned by the first coupling units 120-1, 120-2, 120-3, and 120-4 and the second coupling units 130-1, 130-2, 130-3, and 130-4. First, the hinge shafts 123-1, 123-2, 123-3, and 123-4 of the first coupling units 120-1, 120-2, 120-3, and 120-4 guide and align the display panels 110-1, 110-2, 110-3, and 110-4 into a position where the display panels are adjacent to each other in one direction. Next, the third parts 122c-1, 122c-2, 122c-3, and 122c-4 of the first coupling units 120-1, 120-2, 120-3, and 120-4 and the protrusions PP-1, PP-2, PP-3, and PP-4 of the second coupling units 130-1, 130-2, 130-3, and 130-4 guide and align the first coupling units 120-1, 120-2, 120-3, and 120-4 and the second coupling units 130-1, 130-2, 130-3, and 130-4 into a coupling position in which the first and second coupling units are prevented from moving in a direction along the rear surfaces of the display panels 110-1, 110-2, 110-3, and 110-4. Finally, the first coupling units 120-1, 120-2, 120-3, and 120-4 and the second coupling units 130-1, 130-2, 130-3, and 130-4 are coupled together in a configuration in which the front surfaces and the rear surfaces of adjacent display panels 110-1, 110-2, 110-3, and 110-4 are in contact with each other. Therefore, it is possible to guide and align the display panels 110-1, 110-2, 110-3, and 110-4 such that edges thereof are in a straight line with no gap between adjacent panels. Therefore, in the multi-panel display device 1000, the first coupling units 120-1, 120-2, 120-3, and 120-4 and the second coupling unit 130-1, 130-2, 130-3, and 130-4 guide and align the plurality of display panels 110-1, 110-2, 110-3, and 110-4 in various directions such that the display panels are fixed in the coupling position. The first coupling units 120-1, 120-2, 120-3, and 120-4 and the second coupling units 130-1, 130-2, 130-3, and 130-4 couple the plurality of display panels 110-1, 110-2, 110-3, and 110-4 in a straight line without causing warpage of the plurality of display panels 110-1, 110-2, 110-3, and 110-4.

In the multi-panel display device 1000 according to the exemplary embodiment of the present disclosure, the plurality of display panels 110-1, 110-2, 110-3, and 110-4 are coupled such that at least a part of each non-display area NA overlaps with adjacent display panels. Therefore, the size of the non-display area NA which is visible from the front surface 1002 of the multi-panel display device 1000 is reduced. Specifically, the plurality of display panels 110-1, 110-2, 110-3, and 110-4 are not coupled such that the side surfaces are in contact with each other, but rather, are coupled such that the non-display areas NA overlap each other. Therefore, a width and a size of the non-display area NA which is visible from the front surface 1002 of the multi-panel display device 1000 is reduced, which improves the quality of the image displayed on the multi-panel display device 1000. As a result, immersion of a viewer is increased.

Further, with the multi-panel display device 1000, when one of the plurality of display panels 110-1, 110-2, 110-3, and 110-4 is replaced, only a specific display panel 110-1, 110-2, 110-3, or 110-4 is disassembled without disassembling all the plurality of display panels 110-1, 110-2, 110-3, and 110-4. Specifically, when the plurality of display panels 110-1, 110-2, 110-3, and 110-4 are coupled, the hinge plate 122 of the first coupling units 120-1, 120-2, 120-3, and 120-4 rotates to be positioned over the fixing plate 132 of the second coupling units 130-1, 130-2, 130-3, and 130-4. After rotating the hinge plate 122 to the fixing plate 132, the screw SC is inserted into the hinge plate 122 and the fixing plate 132 to fix the first coupling units 120-1, 120-2, 120-3, and 120-4 and the second coupling units 130-1, 130-2, 130-3, and 130-4. In contrast, when the plurality of display panels 110-1, 110-2, 110-3, and 110-4 is disassembled, the screw SC which is inserted into the first coupling units 120-1, 120-2, 120-3, and 120-4 and the second coupling units 130-1, 130-2, 130-3, and 130-4 is disassembled first. The hinge plate 122 of the first coupling units 120-1, 120-2, 120-3, and 120-4 rotates away from the fixing plate 132 of the second coupling units 130-1, 130-2, 130-3, and 130-4 to separate the first coupling units 120-1, 120-2, 120-3, and 120-4 and the second coupling units 130-1, 130-2, 130-3, and 130-4 from each other. That is, the screw SC is removed and the hinge plate 122 of the first coupling units 120-1, 120-2, 120-3, and 120-4 rotates to release the display panels, which reduces complexity when separating the display panels 110-1, 110-2, 110-3, and 110-4 from each other. Accordingly, when the multi-panel display device 1000 is repaired or disassembled, the first coupling units 120-1, 120-2, 120-3, and 120-4 and the second coupling units 130-1, 130-2, 130-3, and 130-4 may be separated only by removing the screw SC and rotating the hinge plate 122 of the first coupling units 120-1, 120-2, 120-3, and 120-4, in one embodiment. Therefore, the multi-panel display device 1000 may be simply repaired or display panels replaced.

Figure 8:
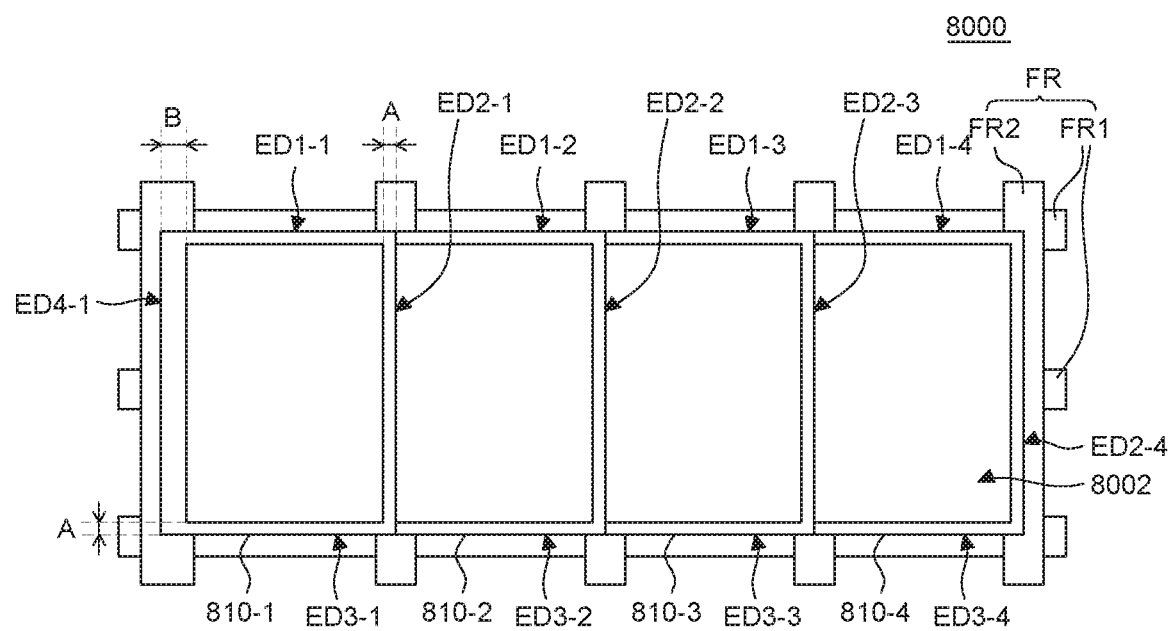
FIG. 8 is a front view of a multi-panel display device according to an alternative embodiment of the present disclosure.
Figure 9:
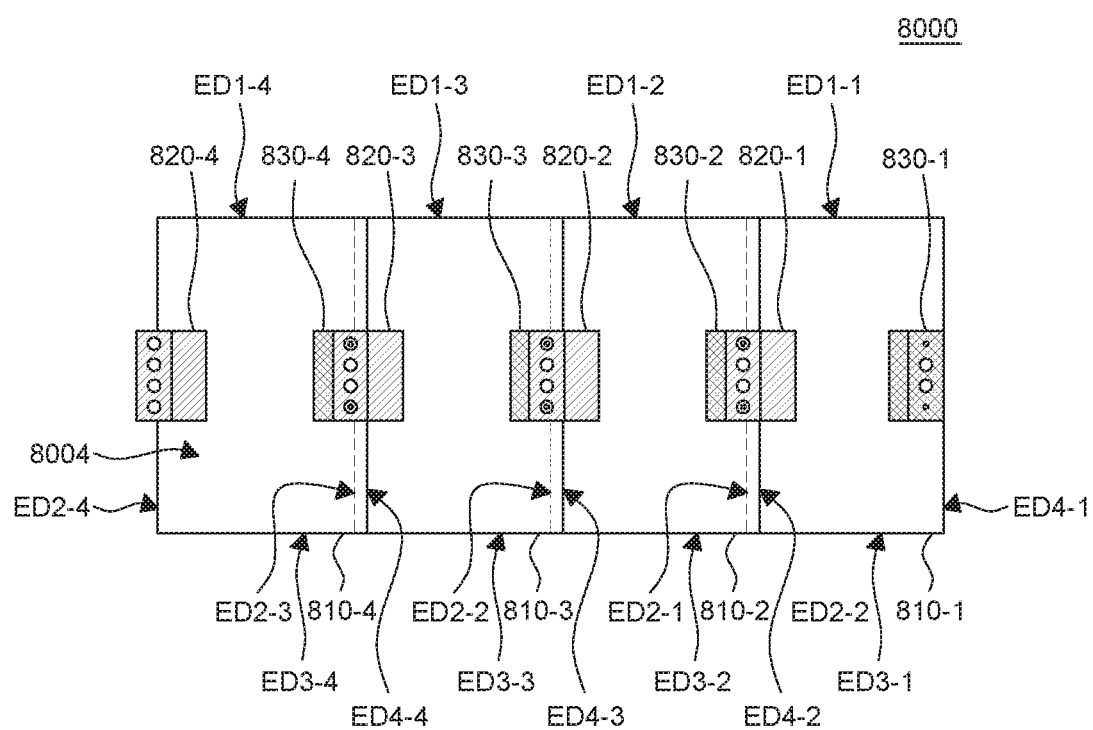
FIG. 9 is a rear view of the multi-panel display device of FIG. 8.

FIG. 8 is a front view of a multi-panel display device 8000 according to an alternative embodiment of the present disclosure. FIG. 9 is a rear view of the multi-panel display device 8000. The device 8000 is the same the multi-panel display device 1000 except for the arrangement of a display panel 810, a first coupling unit 820, and a second coupling unit 830 of the multi-panel display device 8000, among other differences. As such, redundant description has been omitted.

Referring to FIG. 8, the multi-panel display device 8000 includes a plurality of display panels 810-1, 810-2, 810-3, and 810-4 coupled together. The plurality of display panels 810-1, 810-2, 810-3, and 810-4 are coupled such that parts of the non-display areas NA overlap each other. Specifically, the plurality of display panels 810-1, 810-2, 810-3, and 810-4 are coupled such that the non-display area NA at fourth edges ED4-1, ED4-2, ED4-3, and ED4-4 and the non-display area NA at second edges ED2-1, ED2-2, ED2-3, and ED2-4 overlap each other.

A width of the non-display area NA at the fourth edges ED4-1, ED4-2, ED4-3, and ED4-4 is a dimension B which is greater than a dimension A corresponding to a width of the remaining non-display areas NA. In this embodiment, the non-display area NA at the second edges ED2-1, ED2-2, ED2-3, and ED2-4 is disposed to cover the non-display area NA at the fourth edges ED4-1, ED4-2, ED4-3, and ED4-4. Therefore, the width of the non-display area NA at the fourth edges ED4-1, ED4-2, ED4-3, and ED4-4 is greatest. However, the non-display area NA at the fourth edges ED4-1, ED4-2, ED4-3, and ED4-4 on a front surface 8002 of the multi-panel display device 8000 (which is also a front surface 8002 of the display panels) are blocked by the non-display area NA at the second edges ED2-1, ED2-2, ED2-3, and ED2-4 such that the non-display areas NA of the fourth edges ED4-1, ED4-2, ED4-3, and ED4-4 are not visible from the front surface 8002 of the device 8000. Therefore, the widths of the non-display areas NA which are visible from the front surface 8002 of the multi-panel display device 8000 are the same except for the first display panel 810-1 at the outermost side.

For example, because the non-display area NA of the first display panel 810-1 at the second edge ED2-1 overlaps the non-display area NA of the second display panel 810-2 at the fourth edge ED4-2, the width of the non-display area NA which is visible from the front surface of the multi-panel display device 8000 is the dimension A. The width of the non-display area NA at the second edge ED2-1 of the first display panel 810-1 is the dimension A and the width of the non-display area NA at the fourth edge ED4-2 of the second display panel 810-2 is the dimension B. However, the first display panel 810-1 and the second display panel 810-2 are disposed such that the non-display areas NA overlap each other. Therefore, the width of the non-display area NA which is visible from the front surface 8002 is equal to A rather than A plus B. Therefore, the width of the non-display area NA which is visible from the front surface 8002 of the multi-panel display device 8000 is reduced, that is, the size of the non-display area NA where no image is displayed is reduced so that the quality of the image displayed on the multi-panel display device 8000 is improved. Further, the width of the non-display area NA at the boundary between the plurality of display panels 810-1, 810-2, 810-3, and 810-4 is the dimension A and the width of the non-display area NA which is connected in a straight line in the plurality of display panels 810-1, 810-2, 810-3, and 810-4 is also the dimension A so that the widths of the non-display area NA are the same dimension A. Therefore, the non-display area NA visible from the first surface 8002 of the device 8000 has uniform width, which reduces recognition of the non-display area NA and as a result, the quality of the image is improved.

Referring to FIG. 9, the plurality of display panels 810-1, 810-2, 810-3, and 810-4 are coupled to each other with the fourth edges ED4-1, ED4-2, ED4-3, and ED4-4 overlapping the second edges ED2-1, ED2-2, ED2-3, and ED2-4. Therefore, the arrangement of the first coupling units 820-1, 820-2, 820-3, and 820-4 and the second coupling units 830-1, 830-2, 830-3, and 830-4 of the plurality of display panels 810-1, 810-2, 810-3, and 810-4 is different than with the device 1000.

Specifically, the first coupling units 820-1, 820-2, 820-3, and 820-4 are disposed adjacent to the second edges ED2-1, ED2-2, ED2-3, and ED2-4 on a rear surface 8004 of each of the plurality of display panels 810-1, 810-2, 810-3, and 810-4. Further, the second coupling units 830-1, 830-2, 830-3, and 830-4 are disposed adjacent to the fourth edges ED4-1, ED4-2, ED4-3, and ED4-4 on the rear surface 8004 of each of the plurality of display panels 810-1, 810-2, 810-3, and 810-4.

In the multi-panel display device 8000, the display panels 810-1, 810-2, 810-3, and 810-4 are coupled such that an edge of a non-display area NA having the largest width among the non-display areas NA of a plurality of edges overlaps the other display panels 810-1, 810-2, 810-3, and 810-4 to overlap the non-display area NA. In each of the plurality of display panels 810-1, 810-2, 810-3, and 810-4 comprising the multi-panel display device 8000, a width of the non-display area NA at the fourth edges ED4-1, ED4-2, ED4-3, and ED4-4 is greater than a width in the other non-display areas NA. When the plurality of display panels 810-1, 810-2, 810-3, and 810-4 are coupled together, the fourth edges ED4-1, ED4-2, ED4-3, and ED4-4 having the largest width of the non-display areas NA are disposed in contact with the rear surface 8004 of the other display panels 810-1, 810-2, 810-3, and 810-4 proximate the second edges ED2-1, ED2-2, ED2-3, and ED2-4. Therefore, when the multi-panel display device 8000 is viewed from the front surface 8002, the non-display area NA at the fourth edges ED4-1, ED4-2, ED4-3, and ED4-4 having the largest width is not visible. Further, when the multi-panel display device 8000 is viewed from the front surface 8002, the widths of the non-display area NA of the display panels 810-2, 810-3, and 810-4 are the same. In one embodiment, only the width of the non-display area NA of the first display panel 810-1 at the outermost side is different. Therefore, the image quality of the device 8000 is improved and as a result, immersion of the viewer is increased without lowering the quality of the image displayed on the multi-panel display device 8000.

The embodiments of the present disclosure are summarized as follows:

According to one or more embodiments of the present disclosure, there is provided a display device. The display device includes a display panel including a display area and a non-display area, a first coupling unit disposed adjacent to one edge of the display panel and is fixed to a rear surface of the display panel and a second coupling unit disposed adjacent to the other edge of the display panel and is fixed to the rear surface of the display panel. The first coupling unit includes a hinge plate which is hinged with respect to the display panel and includes a plurality of first fastening holes and the second coupling unit includes a fixing plate including a plurality of second fastening holes and protrusions.

At least one of the plurality of second fastening holes of the second coupling unit receives and secures a coupling member which passes through at least one of the plurality of first fastening holes of the hinge plate of another display device adjacent to the display device.

The first coupling unit further includes a first base plate which is fixed to the rear surface of the display panel. The hinge plate is hinged to the first base plate, and the hinge plate includes a first part which is hinged to the first base plate and a second part which extends from the first part at an angle and includes the plurality of first fastening holes disposed therein.

The hinge plate further includes a third part which is extend from an edge of the second part at an angle, wherein the third part restricts the movement of the first coupling unit toward the rear surface of the display panel.

The second coupling unit further includes a second base plate which is fixed to the rear surface of the display panel and the fixing plate includes a first part that extends at an angle from the second base plate and a second part that extends from the first part at an angle with the second base plate and the second part of the fixing plate disposed to be parallel to each other.

A protrusion extends from the second part of the fixing plate and may be inserted into at least one of a plurality of first fastening holes of a hinge plate of another display device which is adjacent to the display device.

According to one or more embodiments of the present disclosure, there is provided a multi-panel display device. The multi-panel display device includes a plurality of display panels each including a display area and a non-display area which surrounds or extends around the display area, wherein the non-display areas overlap each other. A plurality of coupling units are fixed to a rear surface of each of the plurality of display panels. A coupling unit is fixed to a rear surface of a first display panel of the plurality of display panels, which is fixed to a coupling unit of a second display panel adjacent to the first display panel of the plurality of display panels.

The rear surface of the first display panel is in contact with at least a part of a non-display area of the second display panel and a rear surface of the second display panel is in contact with at least a part of a non-display area of a third display panel adjacent to the second display panel of the plurality of display panels.

A non-display area at one edge of the first display panel overlaps a non-display area at the other edge of the second display panel and a non-display area at one edge of the second display panel overlaps a non-display area at the other edge of the third display panel.

A width of the non-display area at one edge of the first display panel may be equal to a width of the non-display area at the other edge of the second display panel and a width of the non-display area at one edge of the second display panel may be equal to a width of the non-display area at the other edge of the third display panel.

A width of the non-display area at one edge of the first display panel may be smaller than a width of the non-display area at the other edge of the second display panel and a width of the non-display area at one edge of the second display panel may be smaller than a width of the non-display area at the other edge of the third display panel.

One edge of the first display panel may cover the other edge of the second display panel and one edge of the second display panel may cover the other edge of the third display panel. As such, a display area and a non-display area of the first display panel, a display area and a remaining non-display area excluding the non-display area at the other edge of the second display panel, and a display area and a remaining non-display area excluding the non-display area at the other edge of the third display panel are visible from the front surface of the multi-panel display device.

The plurality of coupling units include a plurality of first coupling units including a first base plate fixed to rear surfaces of the plurality of display panels and a hinge plate hinged to the first base plate and a plurality of second coupling units including a second base plate fixed to the rear surfaces of the plurality of display panels and a fixing plate extending from the second base plate and bent to overlap the second base plate. The hinge plate of the first coupling unit disposed on the first display panel rotates so as to cover the second coupling unit of the second display panel so that the hinge plate of the first coupling unit of the first display panel may be fixed to the second coupling unit of the second display panel.

A hinge shaft which hinges the first base plate of the plurality of first coupling units and the hinge plate is disposed to the inside from one edge of the plurality of display panels, the hinge shaft of the first coupling unit of the first display panel is in contact with a side of the second display panel and the hinge shaft of the first coupling unit of the second display panel is in contact with a side of the third display panel.

The second display panel is in contact with the hinge shaft of the first coupling unit of the first display panel to restrict movement of the second display panel towards the first display panel and the third display panel is in contact with the hinge shaft of the first coupling unit of the second display panel so that movement into the second display panel is restricted.

A length from the hinge shaft of the first coupling unit of the first display panel to one edge of the first display panel is equal to or greater than a width of the non-display area at the edge which is in contact with the hinge shaft of the first coupling unit of the first display panel among the plurality of edges of the second display panel, and a length from the hinge shaft of the first coupling unit of the second display panel to the one edge of the second display panel is equal to or greater than a width of the non-display area at the edge which is in contact with the hinge shaft of the first coupling unit of the second display panel among the plurality of edges of the third display panel.

Each of the plurality of first coupling units further includes a support unit protruding from the hinge plate, wherein one surface of the support unit of the first coupling unit of the first display panel supports at least one edge among the plurality of edges of the fixing plate of the second coupling unit of the second display panel, and one surface of the support unit of the first coupling unit of the second display panel supports at least one edge among the plurality of edges of the fixing plate of the second coupling unit of the third display panel.

The first coupling unit further includes a plurality of first fastening holes disposed on the hinge plate, the second coupling unit further includes a protrusion protruding from one surface of the fixing plate and a plurality of second fastening holes disposed in the fixing plate, wherein the protrusion of the second coupling unit of the second display panel is inserted into at least one first fastening hole among the plurality of first fastening holes of the first coupling unit of the first display panel, and the protrusion of the second coupling unit of the third display panel is inserted into at least one first fastening hole among the plurality of first fastening holes of the first coupling unit of the second display panel.

At least the other one first fastening hole among the plurality of first fastening holes of the first coupling unit of the first display panel communicates with the plurality of second fastening holes of the second coupling unit of the second display panel, and at least one first fastening hole among the plurality of first fastening holes of the first coupling unit of the second display panel communicates with the plurality of second fastening holes of the second coupling unit of the third display panel.

A screw which passes through at least the other one first fastening hole among the plurality of first fastening holes of the first coupling unit of the first display panel is screw-coupled to the plurality of second fastening holes of the second display panel so that the first coupling unit of the first display panel and the second coupling unit of the second display panel are fixed to each other. A screw which passes through at least one first fastening hole of the first coupling unit of the second display panel is screw-coupled to the plurality of second fastening holes of the third display panel so that the first coupling unit of the second display panel and the second coupling unit of the third display panel are fixed to each other.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
 a first display panel including a display area and a non-display area, the first display panel including a first surface opposite a second surface and a first edge opposite a second edge;
 a first coupling assembly disposed adjacent to the first edge of the first display panel, the first coupling assembly fixed to the second surface of the first display panel; and
 a second coupling assembly disposed adjacent to the second edge of the first display panel and fixed to the second surface of the first display panel,
 wherein the first coupling assembly includes a hinge plate rotatably coupled to the first display panel and a plurality of first fastening holes in the hinge plate, and
 wherein the second coupling assembly includes a fixing plate, the fixing plate including a plurality of second fastening holes and a plurality of protrusions extending from the fixing plate.

2. The display device according to claim 1, further comprising:
 a second display panel, the second display panel including:
 a first coupling assembly coupled to the second display panel, the first coupling assembly including a hinge plate having a plurality of first fastening holes;
 a second coupling assembly coupled to the display panel, the second coupling assembly including a fixing plate, the fixing plate including a plurality of second fastening holes and a plurality of protrusions extending from the fixing plate; and
 a fastener configured to be received in at least one of the plurality of second fastening holes of the second coupling assembly of the first display panel, wherein the fastener is configured to pass through at least one of the plurality of first fastening holes of the hinge plate of the second display panel.

3. The display device according to claim 1, wherein the first coupling assembly further includes a first base plate fixed to the second surface of the first display panel, and
 wherein the hinge plate is rotatably coupled to the first base plate, and
 wherein the hinge plate includes a first portion rotatably coupled to the first base plate and a second portion extending from the first portion, wherein the plurality of first fastening holes are disposed through the second portion.

4. The display device according to claim 3, wherein the hinge plate further includes a third portion extending from an edge of the second portion at an angle to the second portion, and
 wherein the third portion restricts movement of the first coupling assembly toward the second surface of the first display panel.

5. The display device according to claim 1, wherein the second coupling assembly further includes a second base plate fixed to the second surface of the first display panel, and
 wherein the fixing plate includes a first portion extending from the second base plate and a second portion extending from the first portion, and
 wherein the second base plate and the second portion of the fixing plate are disposed parallel to each other.

6. The display device according to claim 5, wherein a protrusion extends from the second portion of the fixing plate and configured to be inserted into at least one of a plurality of first fastening holes of a hinge plate of an adjacent display device.

7. A multi-panel display device, comprising:
 a plurality of display panels each including a display area and a non-display area extending around the display area, wherein the non-display areas of adjacent display panels of the plurality of display panels overlap each other, wherein each display panel of the plurality of display panels includes a first surface opposite a second surface; and a plurality of coupling assemblies fixed to the second surface of each of the plurality of display panels, wherein a first one of the plurality of coupling assemblies corresponding to a first one of the plurality of display panels is configured to be coupled to a second one of the plurality of coupling assemblies corresponding to a second one of the plurality of display panels that is adjacent to the first one of the plurality of display panels.

8. The multi-panel display device according to claim 7, wherein the second surface of the first one of the plurality of display panels is in contact with at least a part of a non-display area of the second one of the plurality of display panels, and wherein a second surface of the second one of the plurality of display panels is in contact with at least a part of a non-display area of a third one of the plurality of display panels adjacent to the second one of the plurality of display panels.

9. The multi-panel display device according to claim 8, wherein the non-display area at an edge of the first one of the plurality of display panels overlaps the non-display area at a first edge of the second one of the plurality of display panels, and wherein the non-display area at a second edge of the second one of the plurality of display panels overlaps the non-display area at an edge of the third one of the plurality of display panels.

10. The multi-panel display device according to claim 9, wherein a width of the non-display area at the edge of the first one of the plurality of display panels is equal to a width of the non-display area at the first edge of the second one of the plurality of display panels, and wherein a width of the non-display area at the second edge of the second one of the plurality of display panels is equal to a width of the non-display area at the edge of the third one of the plurality of display panels.

11. The multi-panel display device according to claim 9, wherein a width of the non-display area at the edge of the first one of the plurality of display panels is less than a width of the non-display area at the first edge of the second one of the plurality of display panels, and wherein a width of the non-display area at the second edge of the second display panel is less than a width of the non-display area at the edge of the third one of the plurality of display panels.

12. The multi-panel display device according to claim 9, wherein the edge of the first one of the plurality of display panels covers the first edge of the second one of the plurality of display panels and the second edge of the second one of the plurality of display panels covers the edge of the third one of the plurality of display panels, and wherein the display area and the non-display area of the first one of the plurality of display panels, the display area and a remaining non-display area excluding the non-display area at the first edge of the second display panel, and the display area and a remaining non-display area excluding the non-display area at the edge of the third display panel are visible from the first surface of each of the plurality of display panels.

13. The multi-panel display device according to claim 7, wherein the plurality of coupling assemblies includes:

a plurality of first coupling assemblies, each first coupling assembly including a first base plate fixed to the second surface of a corresponding one of the plurality of display panels and a hinge plate rotatably coupled to the first base plate; and a plurality of second coupling assemblies including a second base plate fixed to a corresponding one of the second surfaces of the plurality of display panels and a fixing plate extending from the second base plate at an angle to overlap the second base plate, wherein the hinge plate of a first one of the plurality of first coupling assemblies disposed on a first one of the plurality of display panels is configured to be coupled to a second one of the plurality of second coupling assemblies of a second one of the plurality of display panels.

14. A display device, comprising:

a first display panel having an active area and a non-active area, the first display panel including a first surface opposite a second surface and a first edge opposite a second edge, the first display panel further including:

a first coupling assembly including a first base plate coupled to the second surface of the first display panel and a hinge plate rotatably coupled to the first base plate of the first coupling assembly;

a second coupling assembly including a second base plate coupled to the second surface of the first display panel and a fixing plate; and a second display panel having an active area and a non-active area, the second display panel including a first surface opposite a second surface and a first edge opposite a second edge, the second display panel further including:

a first coupling assembly including a first base plate coupled to the second surface of the second display panel and a hinge plate rotatably coupled to the first base plate of the first coupling assembly; and a second coupling assembly including a second base plate coupled to the second surface of the second display panel and a fixing plate, wherein the second coupling assembly of the first display panel is coupled to the first coupling assembly of the second display panel to couple the first display panel to the second display panel.

15. The display device of claim 14 wherein the first base plate and the hinge plate of the first coupling assembly of the first display panel each include a plurality of hinge barrels, the display device further comprising:

a hinge shaft configured to be received in the plurality of hinge barrels of the first base plate and the hinge plate of the first coupling assembly of the first display panel to couple the hinge plate to the first base plate of the first coupling assembly of the first display panel, wherein the hinge shaft is spaced from an edge of each of the first and second display panels, wherein the plurality of hinge barrels are in contact with a side of the second display panel.

16. The display device of claim 15 wherein a dimension from the hinge shaft to a first edge of the first display panel is equal to or greater than a width of the non-display area of the second display panel proximate the first edge of the first display panel and a dimension from the hinge shaft to a second edge of the second display panel is greater than a width of the non-display area of the second display panel proximate the second edge.

17. The display device of claim 14 wherein the first coupling assembly of the display panel further includes a support plate extending from the hinge plate, wherein a surface of the support plate is in contact with an edge of the fixing plate of the second coupling assembly of the first display panel.

18. The display device of claim 14 wherein the first coupling assembly of the second display panel further includes a plurality of first fastening holes disposed through the hinge plate, wherein the second coupling assembly of the first display panel includes a protrusion extending from the fixing plate and a plurality of second fastening holes disposed through the fixing plate, wherein the protrusion is received in a first one of the plurality of first fastening holes, the display device further comprising:
   a fastener coupled to the first coupling assembly of the second display panel and the second coupling assembly of the first display panel through a second one of the plurality of first fastening holes and a first one of the plurality of second fastening holes.

19. The display device of claim 18 wherein the first one of the plurality of second fastening holes includes a plurality of screw threads, the fastener secured to the plurality of screw threads.

20. The display device of claim 19 wherein the second coupling assembly of the first display panel includes a fixing protrusion extending from the fixing plate, the first one of the plurality of second fastening holes disposed through the fixing protrusion and the plurality of screw threads extending from an inner circumferential surface of the fixing protrusion.

\* \* \* \* \*